United States Patent
Russin et al.

(10) Patent No.: US 10,916,462 B2
(45) Date of Patent: Feb. 9, 2021

(54) LASER MARKING FOCUS FEEDBACK SYSTEM HAVING AN INTENSITY INDICATION OF REFLECTED RADIATION PASSED THROUGH AN OBJECTIVE LENS, A BEAM SPLITTER AND A PINHOLE

(71) Applicant: KLA-Tencor Corporation, Milpitas, CA (US)

(72) Inventors: Timothy Russin, Carlsbad, CA (US); Shiyu Zhang, Fremont, CA (US); Charles Amsden, Fremont, CA (US); Daniel Kapp, Pleasanton, CA (US)

(73) Assignee: KLA-TENCOR CORPORATION, Milpitas, CA (US)

( * ) Notice: Subject to any disclaimer, the term of this patent is extended or adjusted under 35 U.S.C. 154(b) by 119 days.

(21) Appl. No.: 16/059,184

(22) Filed: Aug. 9, 2018

(65) Prior Publication Data
US 2019/0122912 A1  Apr. 25, 2019

Related U.S. Application Data

(60) Provisional application No. 62/576,936, filed on Oct. 25, 2017.

(51) Int. Cl.
*H01L 21/67* (2006.01)
*H01L 21/66* (2006.01)
(Continued)

(52) U.S. Cl.
CPC .... *H01L 21/67282* (2013.01); *G02B 27/0955* (2013.01); *G02B 27/283* (2013.01);
(Continued)

(58) Field of Classification Search
CPC .............. G03F 7/70641; G01B 11/026; G01B 9/02042; G01B 9/04; G02B 27/0955;
(Continued)

(56) References Cited

U.S. PATENT DOCUMENTS 5,414,506 A * 5/1995 Saisho ................... G01N 21/41
                                                     356/128
5,672,861 A    9/1997 Fairley et al. ............. 250/201.3
(Continued)

FOREIGN PATENT DOCUMENTS

JP        0798067       1/1997
WO    WO2009043621     4/2009

OTHER PUBLICATIONS

International Search Report and Written Opinion of International Search Authority for PCT/US2018/057463 dated Feb. 13, 2019 (3 pages).

*Primary Examiner* — Que Tan Le
(74) *Attorney, Agent, or Firm* — Imperium Patent Works LLP; Mark D. Marrello (57) ABSTRACT

A method of focusing includes irradiating an object by directing radiation output by a radiating source through an objective lens, measuring a first intensity of reflected radiation that is reflected from the object, adjusting a distance between the objective lens and the object, measuring a second intensity of reflected radiation, and analyzing the first intensity of reflected radiation and the second intensity of reflected radiation to determine a focal distance between the objective lens and the object. The distance between the objective lens and the object is adjusted to the focal distance and the irradiating intensity is increased to mark the object. In another example, measuring the first intensity of reflected radiation is performed by directing reflected radiation from the object through the objective lens, a beam splitter, a focusing lens, and a pinhole and onto a sensor that outputs a signal indicative of sensed radiation intensity.

16 Claims, 7 Drawing Sheets

(51) Int. Cl.
　　　*G02B 27/09*　　　(2006.01)
　　　*G02B 27/28*　　　(2006.01)
　　　*G01B 11/02*　　　(2006.01)
　　　*G02B 7/28*　　　(2021.01)
　　　*H01L 23/544*　　　(2006.01)

(52) U.S. Cl.
　　　CPC ............ *H01L 22/20* (2013.01); *G01B 11/026* (2013.01); *G02B 7/28* (2013.01); *H01L 23/544* (2013.01)

(58) Field of Classification Search
　　　CPC .... G02B 27/283; G02B 7/28; G02B 21/0016; G02B 21/006; G02B 21/0068; H01L 21/6782; H01L 21/67282; H01L 23/544; G01N 21/9501
　　　USPC .......................................... 250/201.1–201.5
　　　See application file for complete search history.

(56) References Cited

U.S. PATENT DOCUMENTS

| | | | |
|---|---|---|---|
| 2006/0285107 A1 | 12/2006 | Garcia et al. | 356/213 |
| 2010/0225926 A1 | 9/2010 | Van Amstel et al. | 356/511 |

\* cited by examiner

WAFER MARKING
FIG. 1

LASER MARKING SYSTEM

FIG. 2

TRIAL AND ERROR LASER MARKING SYSTEM

FIG. 3

LASER MARKING FOCUS FEEDBACK SYSTEM

FIG. 4

FOCUS FEEDBACK ALGORITHM VARIES THE DISTANCE BETWEEN THE OPTICAL LENS OF THE LASER MARKING SYSTEM AND THE TOP SURFACE OF THE WAFER AND DETERMINES THE DISTANCE THAT RESULTS IN THE MAXIMUM MEASURED REFLECTED RADIATION INTENSITY.

FOCUS FEEDBACK ALGORITHM

FIG. 5

LASER MARKING FOCUS FEEDBACK SYSTEM FLOWCHART
FIG. 6

LASER MARKING FOCUS FEEDBACK SYSTEM CONTROL FLOWCHART

FIG. 7

LASER MARKING FOCUS FEEDBACK SYSTEM HAVING AN INTENSITY INDICATION OF REFLECTED RADIATION PASSED THROUGH AN OBJECTIVE LENS, A BEAM SPLITTER AND A PINHOLE

CROSS REFERENCE TO RELATED APPLICATIONS

This application claims priority under 35 U.S.C. § 119 from U.S. Provisional Application No. 62/576,936, entitled "LASER MARKING FOCUS FEEDBACK SYSTEM," filed on Oct. 25, 2017, the subject matter of which is incorporated herein by reference.

TECHNICAL FIELD

The described embodiments relate generally to laser marking and more particularly to use of a focus feedback system to perform laser marking.

BACKGROUND INFORMATION

Marking of semiconductor materials is very important. For example, semiconductor wafers are often marked with fabrication data, lot information, device identification, and possibly yield or defect information in testing environments.

There currently are two major technologies used for marking of electronic devices, namely pad printing and laser marking. Many exposed silicon packages are used in memory applications, and laser marking has been widely accepted in the industry as the best solution for these devices. Because memory devices are low-value products, manufacturers are very focused on cost, so the lower cost of ownership of laser marking compared to traditional ink marking is appealing. The lack of consumables and compatibility with silicon package handling contribute to the lower cost of ownership for laser marking. In addition, the non-contact nature of laser marking is attractive to manufacturers because there are no static issues. However, the speed of laser marking is not as attractive.

Silicon is a very sensitive surface for marking. Minor changes in laser power applied to a silicon surface can cause differences in mark appearance and consistency. Applying such energy so close to active components creates a concern with manufacturers about device damage. As a result, specifications for etch depth or annealing depth have very tight tolerances.

SUMMARY

In a first novel aspect, a focusing system includes a radiating source, a beam splitter configured to reflect radiation output by the radiating source, an objective lens configured to be irradiated by the radiation reflected by the beam splitter, and a sensor. The sensor is configured to be irradiated by a reflected radiation that travels through the objective lens and the beam splitter. The sensor outputs a measured intensity signal that indicates an intensity of the reflected radiation. The irradiation of an object causes the reflected radiation that irradiates the sensor. The object may be various materials such as: a wafer, glass, plastic, quartz, sapphire, silicon, Silicon Carbide (SiC), and Gallium Nitride (GaN). The focusing system also includes a pinhole or an optical fiber configured such that the reflected radiation passes through the objective lens, the beam splitter, a focusing lens, and the pinhole or optical fiber before irradiating the sensor. In one example the sensor is a photodiode.

In a second novel aspect, a focusing devices includes a radiating source, a beam splitter configured to reflect radiation output by the radiating source, an objective lens configured to be irradiated by the radiation reflected by the beam splitter, a sensor configured to be irradiated by a reflected radiation that travels through the objective lens and the beam splitter, a memory, and a processor configured to: read the measured intensity signal output by the sensor, and cause a measured intensity value to be stored in the memory.

In a third novel aspect, method of focusing includes irradiating an object by directing radiation output by a radiating source through an objective lens, measuring a first intensity of reflected radiation that is reflected from the object, adjusting a distance between the objective lens and the object, measuring a second intensity of reflected radiation that is reflected from the object, and analyzing the first intensity of reflected radiation and the second intensity of reflected radiation to determine a focal distance between the objective lens and the object. In one example, the method of focusing includes adjusting the distance between the objective lens and the object to the focal distance, and increasing the irradiating intensity to mark the object. In another example, measuring of the first intensity of reflected radiation is performed by directing reflected radiation from the object through the objective lens, a beam splitter, a focusing lens, and a pinhole and onto a sensor that outputs a signal indicative of sensed radiation intensity.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, relational terms such as "top", "down", "upper", "lower", "top", "bottom", "left" and "right" may be used to describe relative orientations between different parts of a structure being described, and it is to be understood that the overall structure being described can actually be oriented in any way in three-dimensional space.

Figure 1:
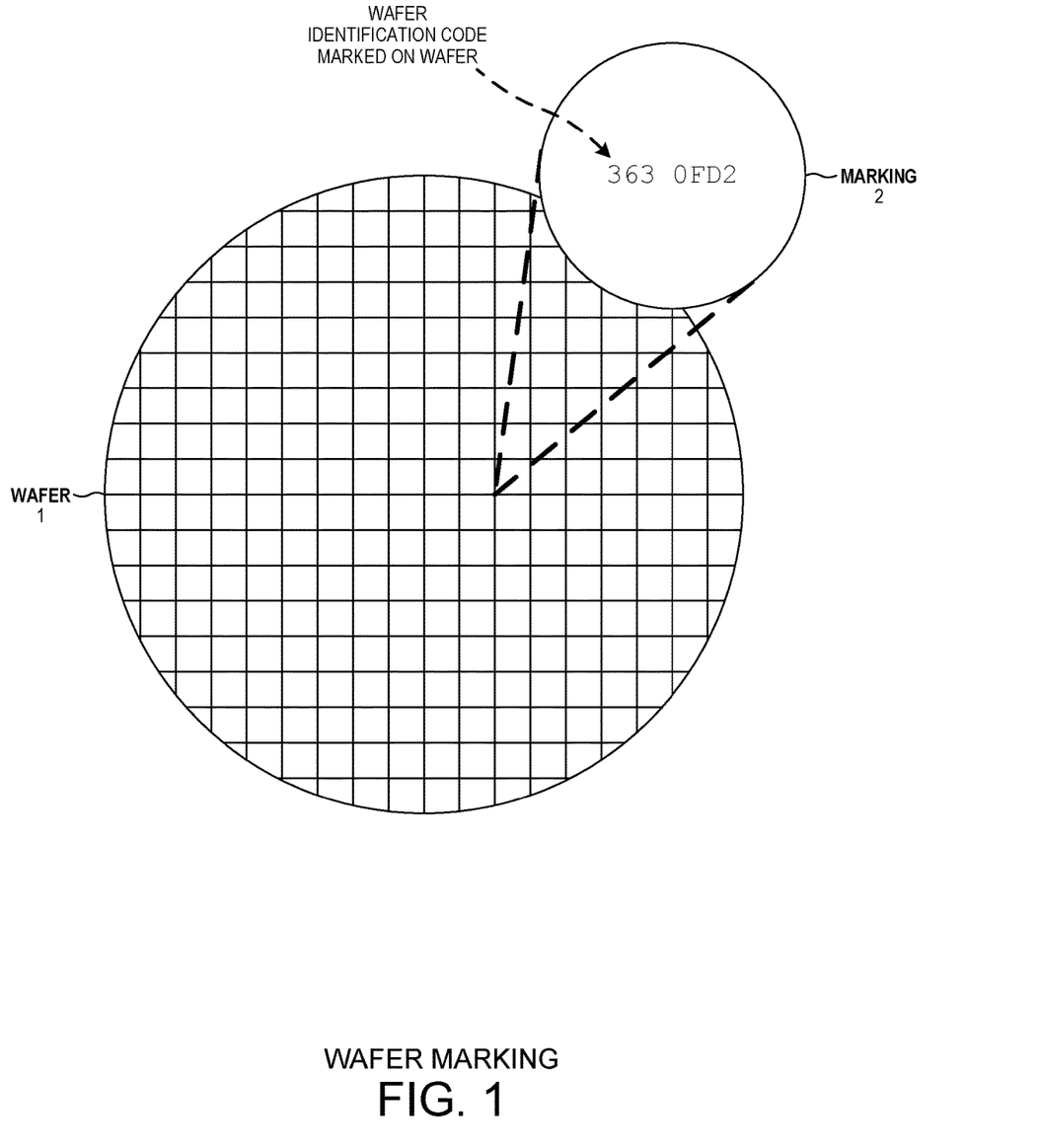
FIG. 1 is a diagram of a wafer 1 (also referred to as an "object") with a blowup illustrating a marking 2 laser etched onto the wafer.

FIG. 1 is a diagram of a wafer 1 that has been marked with marking 2. Marking 2, in one example, is a wafer identification code "363 0FD2". Wafers may be marked with various different types of information. For example, the wafer may be marked with simple dots, a lot number, a fabrication date, a fabrication location, a device or product identification code, yield information, or defect information. The location of wafer markings can also vary greatly. Often, wafer markings will be located at the perimeter of the wafer where there is insufficient remaining area to fabricate another device on the wafer.

It is noted herein, the example of a wafer is used for exemplary use only. This disclosure is not limited to the marking of wafers. Rather, this disclosure is applicable to all non-transparent and transparent objects or samples or wafers or discs regardless of the specific material constituting the sample/wafer/disc or the end device to be manufactured with the developed sample/wafer/disc. Wafers may include at least the following materials: glass, plastic, quartz, sapphire, silicon, Silicon Carbide (SiC), and Gallium Nitride (GaN).

Figure 2:
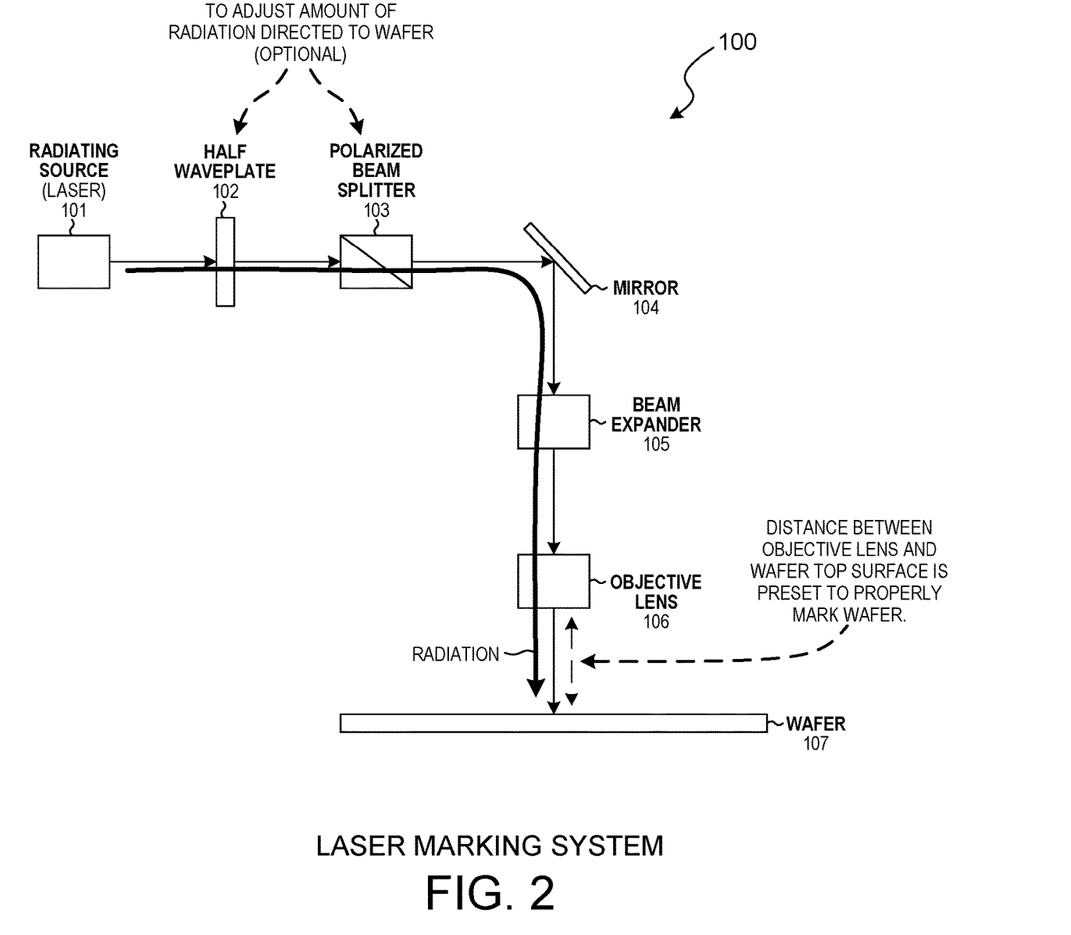
FIG. 2 is a diagram of a laser marking system 100.

FIG. 2 is a diagram of a laser marking system 100. The laser marking system includes a radiating source 101, a half wave plate 102 (optional), a polarized beam splitter 103 (optional), a mirror 104 (optional), a beam expander 105 (optional) and an objective lens 106. In one example, the laser is a five hundred and thirty-two nanometer laser capable of marking a wafer within approximately two micrometers depth of field.

In operation, the radiating source 101 radiates a beam of light that irradiates half wave plate 102, polarized beam splitter 103, mirror 104, beam expander 105 and objective lens 106 before reaching the surface of wafer 107 where the beam of light irradiates the wafer and causes a desired marking to be created.

Half wave plate 102 changes the phase between two perpendicular polarizations by 7C or half a wave. A half-wave plate can be used to rotate the linear polarization of a beam.

Polarized beam splitter 103 is an optical filter that lets light waves of a specific polarization pass through in the desirable direction while directing light waves of other polarization to other direction.

With the attributes of a half wave plate and polarized beam splitter, the combination can be used to adjust the amount of the radiated light (or intensity) by the radiation source 101 is output from the polarized beam splitter 103, thereby adjusting the amount of radiated light that irradiates wafer 107. Adjustment of the light intensity that irradiates the wafer is extremely important to ensure that the wafer is properly marked while also ensuring that the wafer is not damaged during the marking process.

Beam expander 105 is an optical device that takes a collimated beam of light and expand its size (or "waist") when light travels through it in a first direction. When light travels through the beam expander 105 in the reverse direction, it takes a collimated beam of light and reduces its size (or "waist"). Beam expander 105 is an optional feature to change the size (or "waist") of the radiating beam that irradiates the wafer 107.

Objective lens 106 focuses the radiation onto a concentrated area where the desired marking is to be made. While adjusting the intensity of the beam that irradiates the wafer is important, ensuring the beam is focused on the wafer is also important. If the irradiating beam is focused inside of the wafer, a larger mark will occur, and catastrophic damage to the wafer being marked might happen. If the irradiating beam is focused outside of the wafer, more irradiating power will be needed, and no marking might be made on the wafer. Therefore, a solution to ensure proper focus of the irradiating beam on the wafer surface is needed.

Figure 3:
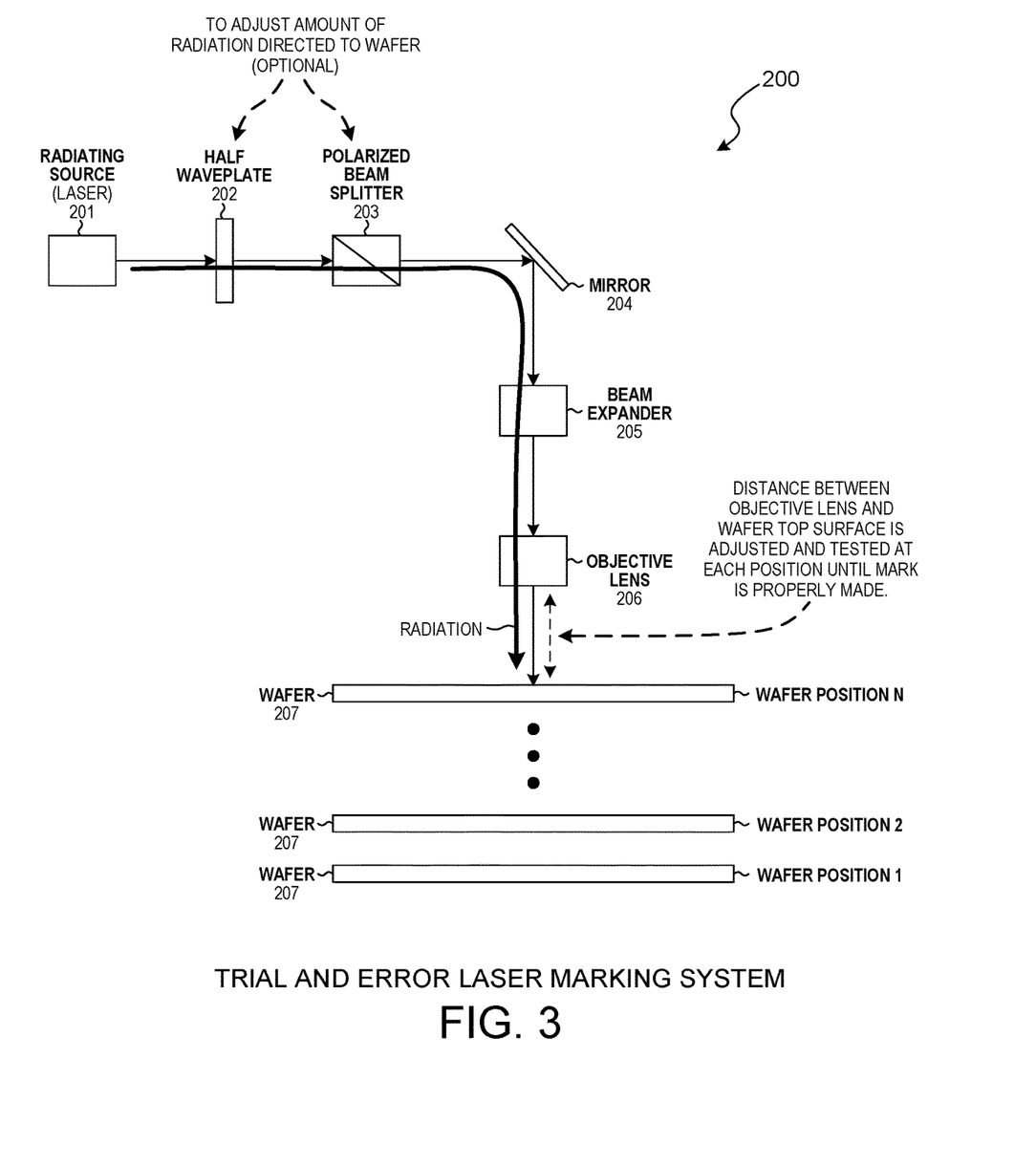
FIG. 3 is a diagram of a trial and error laser marking system 200.

One solution is the "trial and error" method illustrated in FIG. 3. The "trial and error" solution is to simply set a first distance between the objective lens and the wafer, attempt making a mark, then testing to see if the mark was properly made. As illustrated in FIG. 3, the wafer 207 is set to wafer position 1 and then a marking is attempted. If the wafer was not properly marked, then the wafer 207 is adjusted to wafer position 2 and then a marking is attempted again. If the wafer was not properly marked, then the wafer 207 is adjusted to another wafer position and another marking attempt is made. This process continues until a proper mark is made.

This trial and error solution is clearly laborious and slow, as it requires multiple marking operations, multiple repositionings of the wafer, and multiple result tests. A faster and less laborious solution is needed.

Figure 4:
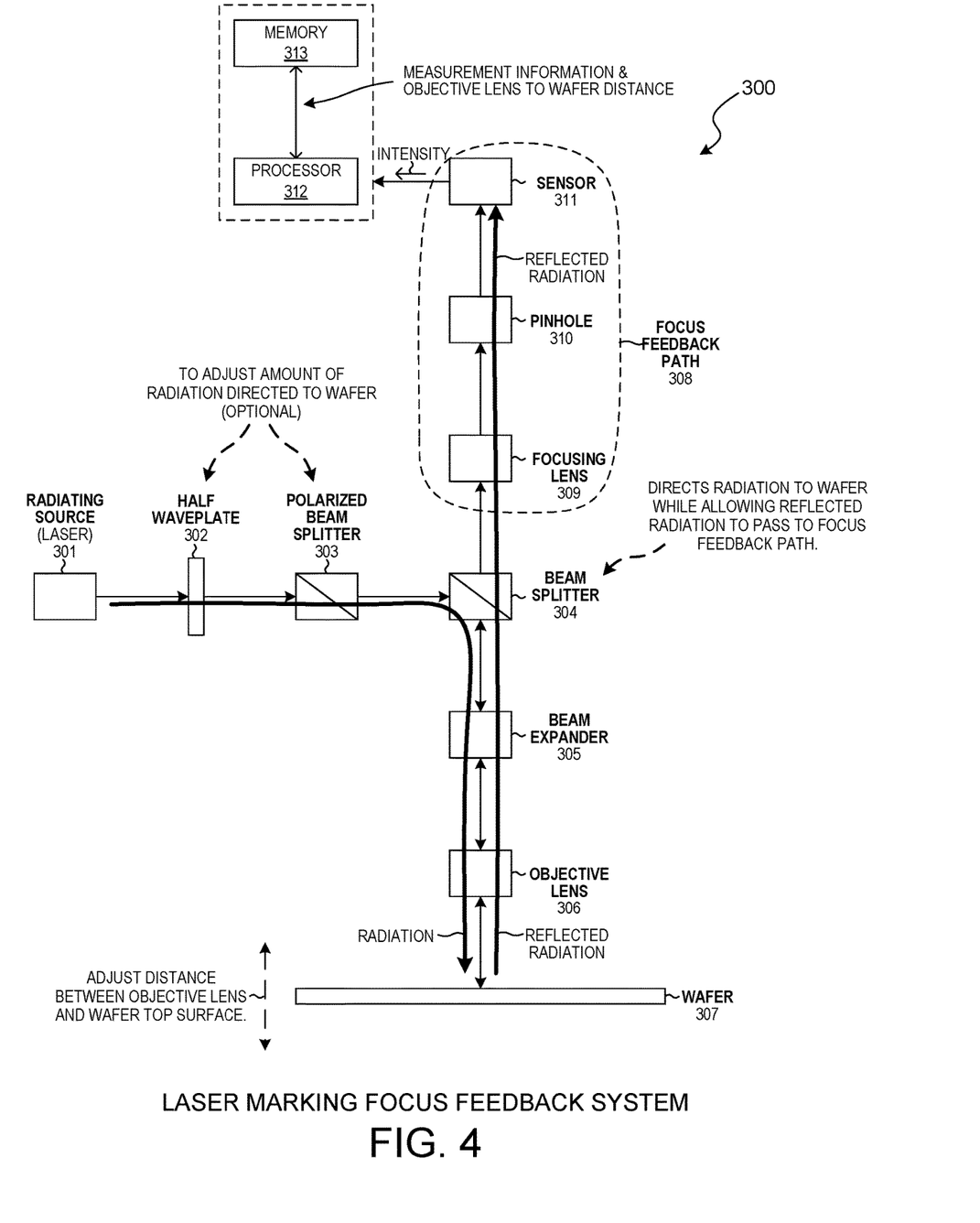
FIG. 4 is a diagram of a laser marking focus feedback system 300.

FIG. 4 is a diagram of laser marking focus feedback system 300. Similar to the laser marking system of FIG. 3, laser marking focus feedback system 300 includes a radiating source 301, a half wave plate 302, a polarized beam splitter 303, a beam expander 305 and an objective lens 306. However, where the laser marking system 200 of FIG. 3 has a simple mirror, the laser marking focus feedback system 300 has a beam splitter 304 that directs the radiation radiated from the radiating source 301 down through the beam expander 305 and through the objective lens 306 to the wafer 307, while allowing the reflected radiation from the wafer 307 to travel through the beam splitter 304 to the focus feedback path 308. Focus feedback path 308 measures the focus of the radiation on wafer 307 by measuring the intensity of the reflected radiation at a sensor 311. In one example, sensor 311 is a photodiode that outputs a current that is proportional to the intensity of the reflected radiation that irradiates the photodiode.

To improve the accuracy of the focus measurement, the focus feedback path 308 may include a focusing lens 309 that performs the function of focusing the reflected radiation on the sensor 311 that measures the intensity of the reflected radiation. Focusing the reflected radiation on sensor 311 improves the accuracy of the intensity measurement because more the reflected radiation is directed the sensor 311.

To even further improve the accuracy of the focus measurement, the focus feedback path 308 may include a pinhole 310. The pinhole 310 is located at, and aligned with, a Gaussian spot that is conjugate to the spot at the wafer. The sensor is positioned behind the pinhole so that reflected radiation traveling through the pinhole irradiates the sensor 311, while the remaining reflected radiation is shielded from the sensor 311. When the wafer is at best focus, the conjugate Gaussian spot from the wafer is projected in the position of the pinhole. Therefore, a maximum amount of reflected radiation (greatest intensity) will travel through the pinhole and be measured by the photodiode. When the wafer is defocused relative to its nominal position, the conjugate Gaussian spot reflected from the wafer and transmitted to the pinhole will be defocused as well. For a Gaussian laser beam, this defocus translates directly to an increase in beam size. Therefore, given the larger beam size, a larger percentage of the reflected radiation will be blocked by the pinhole, and therefore the reflected radiation measured by the photodiode (intensity) will be reduced. The size of pinhole 310 will be smaller than two times the 1/e2 diameter of the laser beam waist size at the sensor location. A preferred size of 310 will be around the full size half maximum of the laser beam at the sensor location, Alternatively, the focus feedback path 308 may include an optical fiber instead of a pinhole. The optical fiber has a core diameter that is the same as the diameter of the pinhole and functions to block unfocused light in the same fashion.

Beam expander 305 is an optional element that improves the accuracy of the focus feedback path 308 by increasing the size of the radiating beam and therefore also increase the size of the reflected radiation from the wafer 307 that is directed to pinhole 310. Accuracy of the focus feedback path 308 is increased because an increase in the size of the reflected radiation will cause more of the reflected radiation to be blocked by the pinhole when the wafer is not in focus, thereby making the change in measured intensity more prominent when the wafer is at best focus.

Figure 5:
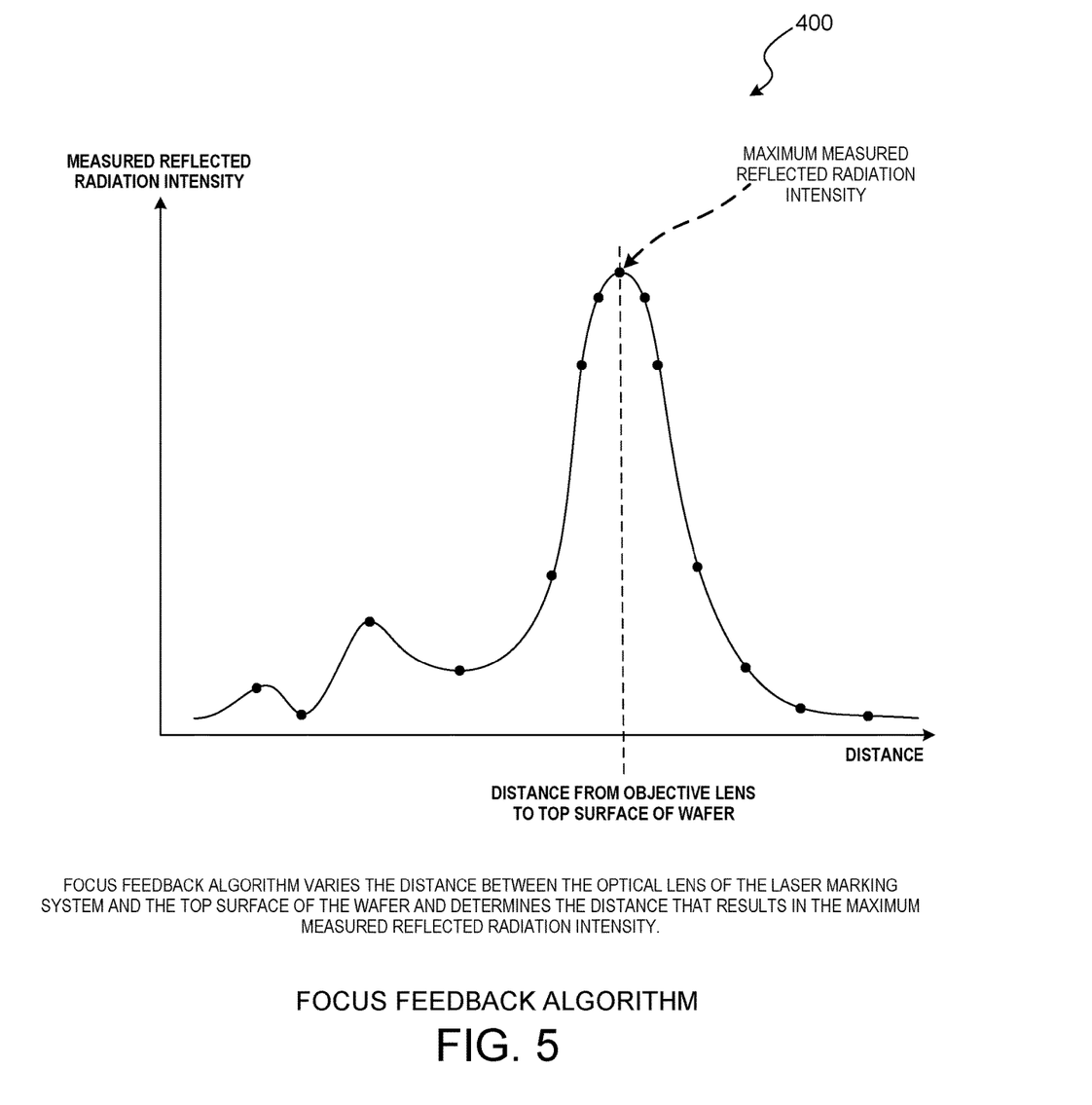
FIG. 5 is a graph of a focus feedback algorithm 400.

In operation, the current output by the photodiode is measured at each wafer position (distance from the objective lens to the wafer). The output current is proportional to the measured reflected radiation intensity. The output current is measured and then recorded for each wafer position as is illustrated in FIG. 5. The wafer position (distance from the objective lens to the wafer) where the wafer is in best focus can be determined using multiple different methods.

It is noted herein, that the distance between the objective lens and the wafer can be adjusted using two methods. In a first method, the position of the wafer is adjusted while the position of the objective lens is unchanged. In a second method, the position of the objective lens is adjusted while the position of the wafer is unchanged.

In a first method, the wafer location corresponding to the maximum measured current (measured reflected radiation intensity) is determined to be the wafer location where the wafer is at best focus.

In a second method, the measured currents (measured reflected radiation intensities) at different wafer positions are used to generate a best fit curve. The peak of the best fit curve is then calculated. Lastly, a wafer position of the calculated peak is determined and deemed to be the wafer position where the wafer is at best focus. One skilled in the art will readily appreciate that other estimation methods may be used.

Figure 6:
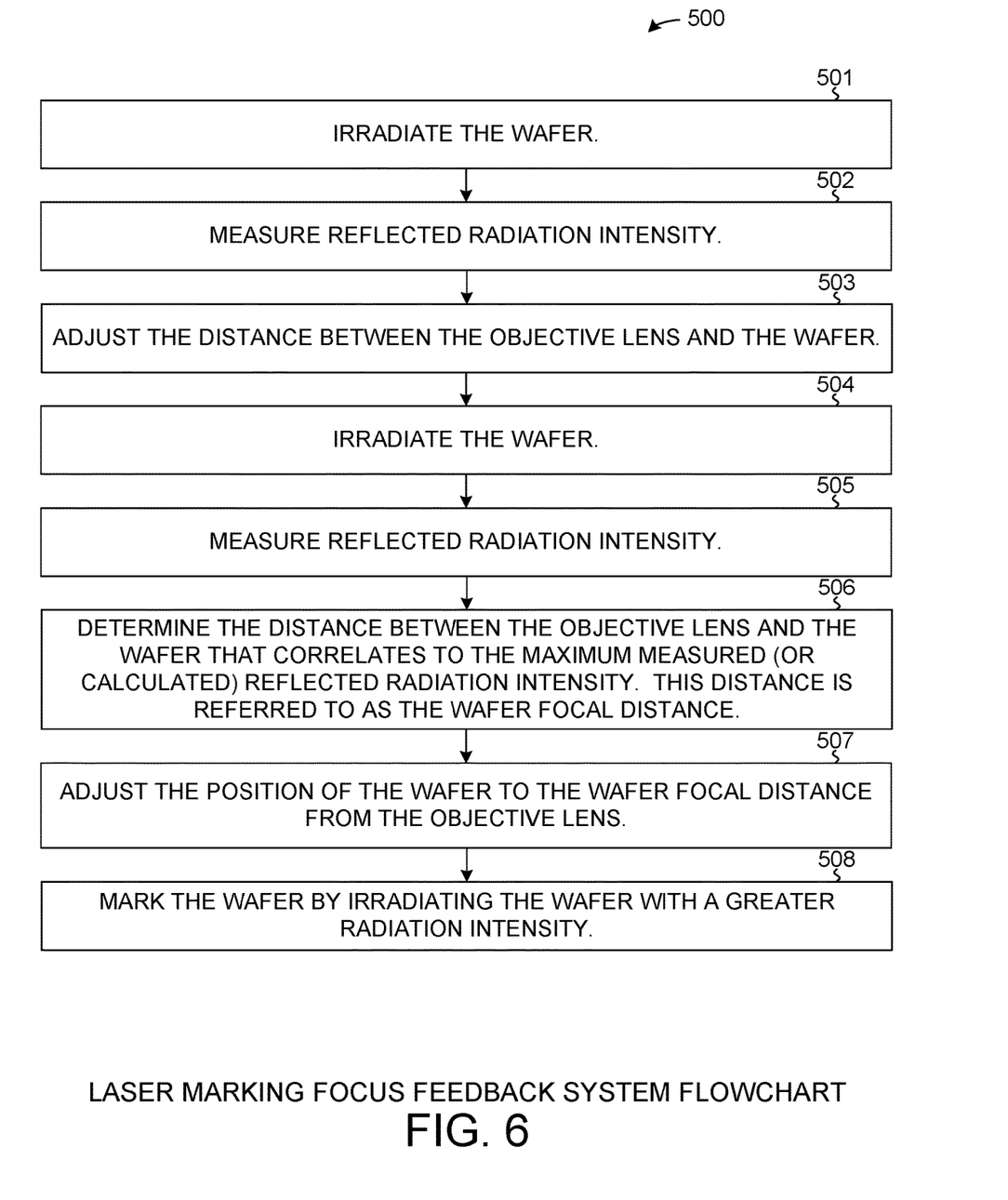
FIG. 6 is a flowchart 500 illustrating the various steps performed by a laser marking focus feedback system.

FIG. 6 is a flowchart 500 illustrating the steps included in a laser marking focus feedback system. In step 501, a wafer is irradiated by radiation that passes through an objective lens. In step 502, the intensity of radiation reflected from the wafer (reflected radiation) is measured. In one example, the reflected radiation is measured using a photodiode that outputs a current that is proportional to the intensity of the radiation incident on the photodiode. In another example, the reflected radiation is measured using a photomultiplier tube that outputs a current that is proportional to the intensity of the radiation incident on the photomultiplier tube.

In step 503, the distance between the objective lens and the wafer is adjusted. In step 504, the wafer is once again irradiated by the radiation that passes through the objective lens. In step 505, the intensity of radiation reflected from the wafer (reflected radiation) is measured. For improved accuracy, steps 501 through 505 may be further repeated to generate a higher resolution mapping of measured reflected radiation verses the distance between the objective lens and the wafer.

In step 506, a distance between the objective lens and the wafer that results in the radiation to be focused at the irradiated surface of the wafer is determined. This distance is referred to herein as the "wafer focal distance". The wafer focal distance can be determined using various methods.

In a first method, the wafer focal distance is deemed to be the distance where the maximum reflected radiation was measured.

In a second method, the wafer focal distance is calculated based on the multiple measured reflected radiation intensities at different distances. For example, the reflected radiation measurements and the distances at which they were measured are used to estimate a best fit curve (measured reflected radiation verses the distance between the objective lens and the wafer). Once the best fit curve is generated, the distance corresponding to the peak of the best fit parabola is deemed to be the wafer focal distance. One skilled in the art will readily appreciate that many other methods can be used to calculate the wafer focal distance based on the reflected radiation measurements.

In step 507, the wafer position is adjusted so that the objective lens is separated from the wafer by the wafer focal distance. In step 508, the intensity of the irradiation is increased and the wafer is marked as desired. By way of performing steps 501 through 507, only a single attempt is needed to mark the wafer. Further, performing steps 501 through 507 prevents the wafer from damaged caused by multiple marking attempts at different wafer positions. Moreover, performing the steps of 501 through 507 ensures that the desired marking is made with maximum accuracy because the irradiation is properly focused on the wafer when the marking is performed.

Another valuable benefit from performing the method described in steps 501 through 507 is the reduction of time necessary to determine the wafer focal distance. In the prior art, the wafer position was set to a first wafer position and a marking attempt was made. The mark was then checked and in the event that the mark was not properly made, then the wafer position was adjusted and another marking attempt was made. This process continued until either the wafer was properly marked or the wafer was damaged from multiple marking attempts. Using this method of determining the wafer focal distance before marking eliminates the need for multiple marking attempts to be made. Rather, using the method outlined in steps 501 through 508, an automated system can quickly determine the wafer focal distance without damaging the wafer and then properly mark the wafer in a single marking attempt. This tremendously reduces the time need to properly mark a wafer and greatly reduces the costs of wafer marking.

Figure 7:
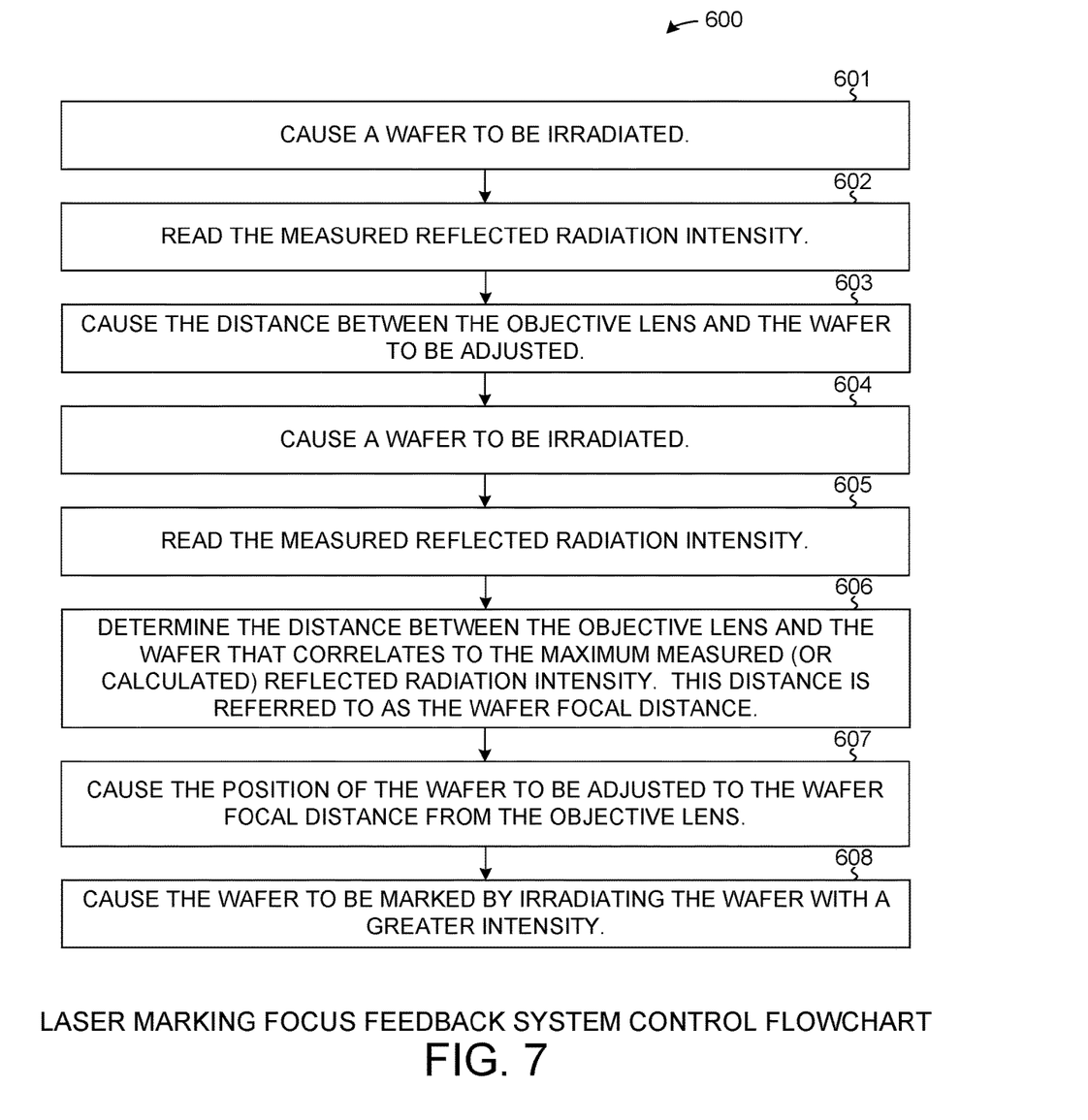
FIG. 7 is a flowchart 600 illustrating the various steps performed by a laser marking focus feedback control system.

FIG. 7 is a flowchart 600 illustrating the steps included in a laser marking focus feedback control system. The steps illustrated in flowchart 600 may be performed by one or more processors that execute code stored on a memory. In step 601, a wafer is caused to be irradiated by radiation that passes through an objective lens. This step may be performed by a processor sending a command to an electronically controlled radiating source, such as a laser. In step 602, the measured intensity of radiation reflected from the wafer (reflected radiation) is read. In one example, the intensity is read from the output of a digital-to-analog converter. In another example, the intensity is read from a memory.

In step 603, the distance between the objective lens and the wafer is caused to be adjusted. This step may be performed by a processor sending a command to an electronically controlled wafer placement mechanism. In step 604, the wafer is caused to be once again irradiated by the radiation that passes through the objective lens. In step 605, the measured intensity of radiation reflected from the wafer (reflected radiation) is read. Steps 601 through 605 may be further repeated to generate a higher resolution mapping of measured reflected radiation verses the distance between the objective lens and the wafer.

In step 606, a distance between the objective lens and the wafer that results in the radiation to be focused at the irradiated surface of the wafer is determined. This distance is referred to herein as the "wafer focal distance". The wafer focal distance can be determined using various methods.

In a first method, the wafer focal distance is deemed to be the distance where the maximum reflected radiation was measured.

In a second method, the wafer focal distance is calculated based on the multiple measured reflected radiation intensities at different distances. For example, the reflected radiation measurements and the distances at which they were measured are used to estimate a best fit parabola (measured reflected radiation verses the distance between the objective lens and the wafer). Once the best fit parabola is generated, the distance corresponding to the peak of the best fit parabola is deemed to be the wafer focal distance. One skilled in the art will readily appreciate that many other methods can be used to calculate the wafer focal distance based on the reflected radiation measurements.

In step 607, the wafer position caused to be adjusted so that the objective lens is separated from the wafer by the wafer focal distance. In step 608, the intensity of the irradiation is increased and the wafer is marked as desired. This step may be performed by a processor sending a command to an electronically controlled radiating source, such as a laser. By way of performing steps 601 through 607, only a single attempt is needed to mark the wafer. Further, performing steps 601 through 607 prevents the wafer from damaged caused by multiple marking attempts at different wafer positions. Moreover, performing the steps of 601 through 607 ensures that the desired marking is made with maximum accuracy because the irradiation is properly focused on the wafer when the marking is performed.

Another valuable benefit from performing the method described in steps 601 through 601 is the reduction of time necessary to determine the wafer focal distance. In the prior art, the wafer position was set to a first wafer position and a marking attempt was made. The mark was then checked and in the event that the mark was not properly made, then the wafer position was adjusted and another marking attempt was made. This process continued until either the wafer was properly marked or the wafer was damaged from multiple marking attempts. Using this method of determining the wafer focal distance before marking eliminates the need for multiple marking attempts to be made. Rather, using the method outlined in steps 601 through 608, an automated system can quickly determine the wafer focal distance without damaging the wafer and then properly mark the wafer in a single marking attempt. This tremendously reduces the time need to properly mark a wafer and greatly reduces the costs of wafer marking.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A focusing system, comprising:
   a radiating source;
   a beam splitter configured to reflect radiation output by the radiating source;
   an objective lens configured to be irradiated by the radiation reflected by the beam splitter;
   a sensor, wherein the sensor is configured to be irradiated by a reflected radiation that travels through the objective lens and the beam splitter, wherein the sensor outputs a measured intensity signal that indicates an intensity of the reflected radiation;
   a half wave plate, wherein the half wave plate is configured such that the radiation output by the radiation source irradiates the beam splitter; and
   a pinhole, wherein the pinhole is configured such that the reflected radiation passes through the objective lens, the beam splitter, and the pinhole before irradiating the sensor, wherein the pinhole is located a position that is conjugate the position of the irradiation of an object.

2. The focusing system of claim 1, wherein irradiation of the object causes the reflected radiation that irradiates the sensor.

3. The focusing system of claim 2, wherein the object is one of: a wafer, glass, plastic, quartz, sapphire, silicon, Silicon Carbide (SiC), or Gallium Nitride (GaN).

4. The focusing system of claim 1, further comprising:
   a polarized beam splitter, wherein the polarized beam splitter is configured such that the radiation output by the radiation source passes through the polarized beam splitter before irradiating the beam splitter.

5. The focusing system of claim 1, further comprising:
   a beam expander, wherein the beam expander is configured such that the radiation output by the radiation source passes through the beam expander before irradiating the objective lens.

6. The focusing system of claim 1, further comprising:
   a focusing lens, wherein the focusing lens is configured such that the reflected radiation passes through the objective lens, the beam splitter, and the focusing lens before irradiating the sensor.

7. The focusing system of claim 1, wherein the sensor is a photodiode, and wherein the pinhole is between five percent and two-hundred percent of the radiation beam waist diameter.

8. The focusing system of claim 1, further comprising:
   an optical fiber, wherein the optical fiber is configured such that the reflected radiation passes through the objective lens, the beam splitter, and the optical fiber before irradiating the sensor.

9. The focusing system of claim 1, further comprising:
   a memory; and
   a processor configured to:
      read the measured intensity signal output by the sensor; and
      cause a measured intensity value to be stored in the memory.

10. The focusing system of claim 9, wherein the processor is further configured to control a distance between the objective lens and an object to be irradiated.

11. The focusing system of claim 10, wherein the processor is further configured to control the intensity of the radiation output by the radiating source.

12. The focusing system of claim 11, wherein the processor causes the radiation output by the radiating source to be a lower value when the object is not to be marked.

13. The focusing system of claim 11, wherein the processor causes the radiation output by the radiating source to be a higher value when the object is to be marked.

14. The focusing system of claim 11, wherein the processor is configured to read a first measured intensity signal output by the sensor when the object is a first distance from the objective lens, wherein the processor is configured to read a second measured intensity signal output by the sensor when the object is a second distance from the objective lens, and wherein the first measured intensity, the first distance, the second measured intensity, and the second distance are stored in the memory.

15. The focusing system of claim 14, wherein the processor determines that the first measured intensity is greater than the second measured intensity, and wherein the processor causes the object to be the first distance from the objective lens.

16. The focusing system of claim 15, wherein the processor causes the radiation output by the radiating source to be a higher value when the object is the first distance from the objective lens.

* * * * *